US 9,732,852 B2
Aug. 15, 2017

United States Patent
Favaron

(54) THREE-PIECE OIL RING FOR INTERNAL COMBUSTION ENGINES, EXPANDING ELEMENT, AND ANNULAR ELEMENT

(71) Applicants: Mahle Metal Leve S/A, Jundiaí-Sp (BR); Mahle International GmbH, Stuttgart (DE)

(72) Inventor: Rodrigo Favaron, São Paulo (BR)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 0 days.

(21) Appl. No.: 14/431,477

(22) PCT Filed: Sep. 24, 2013

(86) PCT No.: PCT/BR2013/000366
§ 371 (c)(1),
(2) Date: Mar. 26, 2015

(87) PCT Pub. No.: WO2014/047703
PCT Pub. Date: Apr. 3, 2014

(65) Prior Publication Data
US 2015/0240945 A1    Aug. 27, 2015

(30) Foreign Application Priority Data
Sep. 27, 2012    (BR) ............................ 102012024729

(51) Int. Cl.
*B60T 11/236*    (2006.01)
*F16J 9/26*    (2006.01)
(Continued)

(52) U.S. Cl.
CPC ................. *F16J 9/26* (2013.01); *C23C 16/30* (2013.01); *F16J 9/061* (2013.01); *F16J 9/064* (2013.01); *F16J 9/12* (2013.01)

(58) Field of Classification Search
CPC ........ F16J 9/26; F16J 9/061; F16J 9/12; F16J 15/441; F16J 15/442; F16J 15/40;
(Continued)

(56) References Cited

U.S. PATENT DOCUMENTS 3,053,694 A * 9/1962 Daunt ................... F01D 11/122
                                                      106/626
3,583,713 A * 6/1971 Sugahara ................... F16J 9/26
                                                      277/444
(Continued)

FOREIGN PATENT DOCUMENTS

BR    I9917267-4    12/2010
JP    6 235462    *    6/1994
(Continued)

OTHER PUBLICATIONS

Homogeneous definition The free Dictionary.*
English abstract for JP5306461.
English abstrac for JP6-235462.

*Primary Examiner* — Kristina Fulton
*Assistant Examiner* — Nathan Cumar
(74) *Attorney, Agent, or Firm* — Fishman Stewart PLLC

(57) ABSTRACT

A three-piece oil ring for an internal combustion engine may include an expanding element defining at least a first side and a second side opposite the first side. A first upper annular segment may be associated with the first side of the expanding element. A second lower annular segment may be associated with the second side of the expanding element. The first annular segment and the second annular segment may each include a first internal side surface and a second external side surface. A metallic tungsten matrix coating may be disposed on at least one of the expanding element, the first annular segment and the second annular segment via chemical vapor deposition. The coating may contain a tungsten nanocarbide that may include at least one of WC, (Continued)

W2C, W3C and W12C. The coating may include a thickness between 5 μm and 150 μm and a hardness between 1000HV and 3500HV.

19 Claims, 3 Drawing Sheets

(51) Int. Cl.
    *C23C 16/30* (2006.01)
    *F16J 9/06* (2006.01)
    *F16J 9/12* (2006.01)

(58) Field of Classification Search
    CPC ... C23C 16/30; C23C 16/32; B32B 2307/536; B23P 15/06; B23P 25/00; Y10T 428/12056; Y10T 428/12458; Y10T 428/12576
    USPC ...... 277/442; 428/552, 610, 527; 427/249.1, 427/17, 18
    See application file for complete search history.

(56) References Cited

U.S. PATENT DOCUMENTS

| | | | | |
|---|---|---|---|---|
| 3,606,359 | A | * | 9/1971 | McCormick ............. C23C 4/06 277/442 |
| 4,876,158 | A | * | 10/1989 | Onuki ..................... C22C 29/12 277/444 |
| 5,106,674 | A | * | 4/1992 | Okada ..................... C22C 29/02 407/119 |
| 5,598,763 | A | * | 2/1997 | Rao ........................... F16J 1/08 277/442 |
| 5,718,437 | A | | 2/1998 | Tanaka et al. |
| 2009/0117372 | A1 | * | 5/2009 | Zhuk ..................... B32B 15/013 428/336 |
| 2010/0319647 | A1 | * | 12/2010 | Ogawa ..................... C22C 21/00 123/193.2 |
| 2012/0205875 | A1 | | 8/2012 | Kennedy et al. |

FOREIGN PATENT DOCUMENTS

| | | | |
|---|---|---|---|
| JP | 6 235462 | * | 8/1994 |
| JP | 6-235462 | | 8/1994 |
| JP | 5306461 | | 5/2013 |

* cited by examiner

THREE-PIECE OIL RING FOR INTERNAL COMBUSTION ENGINES, EXPANDING ELEMENT, AND ANNULAR ELEMENT

CROSS-REFERENCE TO RELATED APPLICATIONS

This application claims priority to Brazilian Patent Application No. 102012024729-1, filed Sep. 27, 2012, and International Patent Application No. PCT/BR2013/000366, filed Sep. 24, 2013, both of which are hereby incorporated by reference in their entirety.

TECHNICAL FIELD

The present invention relates to a three-piece oil control ring for use in the groove of a piston of an internal combustion engine, wherein a coating is applied onto the expander and/or upper and lower annular segments being applied by the chemical deposition process (CVD=chemical vapor deposition), imparting long durability to the resulting ring and keeping the manufacture cost acceptable.

The present invention further relates to an expending element and to an annular element that composes the three-piece oil control ring, to which said coating is applied by the chemical deposition process (CVD).

BACKGROUND

Internal combustion engine are energy transforming mechanisms used by the vast majority of automotive vehicles, and comprise basically two main parts, namely: one or more engine head and the engine block. At the base of the head (s) are located combustion chambers (on Diesel engines in general the combustion chambers are arranged on the pistons heads) and on the engine block are located the cylinders and the crankshaft assembly. The crankshaft is composed by pistons, rods and crankshaft.

The engine converts produced by the combustion of the mixture (fuel and air) in the combustion chambers into mechanical energy capable of causing the wheels to turn.

Since the power required to move the automobile comes from the burning of the air/fuel mixture in the combustion chamber, and in order to ensure a homogeneous combustion, without burning oil, and still prevent the excessive passage of gases from the cylinder to the crankcase, it is necessary to use rings for providing good sealing of the clearance existing between the piston and the cylinder wall.

On most present-day internal combustion engines that operate according to the Otto and Diesel cycles, one uses three rings, two of which are compression rings and one is the oil control ring (scraper). The compression rings have the function of preventing passage of the gases from combustion into the crankshaft and the oil ring has the function of scraping the excess oil from the cylinder wall and return it to the crankshaft, controlling the oil-film thickness, so that the functioning of the engine will take place within the premises of the design and operation.

The oil scraping ring may be of one, two or three parts. The present solution has been developed in the form of a three-piece ring, which, as a general rule, has a first upper annular segment and a second lower annular segment, associated to an expanding intermediate element, which presses in a controlled manner the upper and lower segments against the cylinder wall. The force exerted by the expanding element, which is nothing else than a resilient element, is calculated so that the oil film on the cylinder wall will have the desired thickness.

At present, the need for greater thermal efficiency and specific power of the engines, markedly due to the limits of emission of pollutants and consumption of fuel and lubricating oil, have led to an increase in the thermal stresses and mechanical to which the internal components of the engines are subjected, among which are the oil scraping rings. Thus, in some more recent applications, the reduction of the durability of these components has been considerable, bringing about improvements.

The Japanese patent JP 5306461 relates to a sliding member whatever for use on an internal combustion engine, to which one applies a high-hardness TiCN coating, by the CVD process.

The coating is applied at a temperature of about 500° C.-600° C. with application of a gaseous mixture of TiCl4, H2, CH4 and N2, heating up to the plasma phase and evaporation up to the formation of a high-hardness film (between 2500 and 3000 Vickers) of 2 µm-20 µm.

This document, however, does not mention the formation of a tungsten carbide coating or the application thereof to oil scraping ring.

The Japanese prior-art document JP 3801250 relates to a 2-part oil-scraping ring, on which the external surface receives a coating applied by PVD or CVD. More specifically, one applies a coating by PVD or CVD to a geometrically specified surface, having a chamfered, angled or inclined surface, parallel to its internal circumference and with width between 0.15 mm and 0.3 mm.

This document, however, does not mention the formation of a tungsten carbide coating or even the application thereof to three-piece oil scrapers.

Document JP 06235462 relates to a three-piece combined ring, wherein the upper and lower annular segments receive the application of a TiCN coating of high hardness, by the CVD process, with thickness ranging from 3 µm to 15 µm, on its internal side surface and a chrome nitride coating ranging from 5 µm to 50 µm, applied by the ion-plating process onto its external side surface.

This document, however, does not mention the formation of a tungsten carbide coating or even the deposition thereof onto the ring expanding element.

European patent document EP 1686295 relates to a three-piece oil ring, on which the scraping element comprises the protrusions for association of the annular segments of austenitic stainless steel subjected to a nitriding treatment at a temperature of 470° C. or higher, so as to form a nitride layer of 10 to 60 microns. Alternatively, a coating (resin) layer is formed on at least one surface of the expander facing the surfaces of the annular segments or else on the surfaces of the annular segments that interact with the spacer.

This document, however, does not mention the formation of a tungsten carbide coating by CVD or even the deposition thereof onto the ring expanding element.

The patent document U.S. Pat. No. 5,718,437 relates to a three-piece oil ring where the upper and lower annular segments are made from martensitic stainless steel and receive a nitriding treatment. The expanding element, in turn, has a nitriding layer, onto which one applies a chrome nitride coating, formed by the ion-plating process on the circumferential outer surface of the part.

This document, however, does not mention the formation of a tungsten carbide coating by CVD or even the deposition thereof onto the ring expanding element.

The prior-art document BRPI 0516273-4 relates to a material resistant to wear, erosion and chemically resistant containing carbon-bound tungsten, the carbon being present in an amount ranging from 0.01% by weight to 0.097% by weigh of the total weight. The material preferably comprises a metallic tungsten matrix with tungsten carbide nanoparticles having particle size not larger than 50 nanometers, preferably not larger than 10 nanometers. The material is optionally also bonded to fluorine, the fluorine being present in an amount ranging from 0.01% by weight to 0.4% by weigh of the total weight.

This document, however, does not mention the formation of a tungsten carbide coating with deposition thereof onto an oil ring of an engine.

Finally, document BRPI 9917267-4 relates to a tungsten carbide alloy with addition of fluorine by up to 0.5% by weight and the fluorocarbon compositions. These alloys may be produced from a new chemical deposition process (CVD), in which tungsten hexachloride gases and gases containing carbon and hydrogen are used.

A specific feature of said process is the previous thermal activation of the carbon-containing gas. The tungsten carbide coating is applied onto the component whose strength one intends to increase.

Analogously, this document does not mention the formation of a tungsten carbide coating deposited on an engine oil ring.

In view of the aforesaid, a three-piece oil scraping ring whose expander and/or upper and lower annular segments is coated by means of the chemical deposition process (CVD), rendering the resulting ring high durability and maintaining its manufacture costs acceptable, has not been developed so far.

SUMMARY

The present invention aims at providing a three-piece ring for use in the groove of a piston of an internal combustion engine whose expander and/or upper and lower annular segments are coated with tungsten carbide by means of the chemical deposition process (CVD), at a temperature which ranges between 450° C. and 650° C.

The present invention also focuses on the expander and/or the upper and lower annular segments, alone, onto which a tungsten carbide coating is applied by means of the chemical deposition process (CVD), at a temperature which ranges between 450° C. and 650° C. The expander and the upper and lower annular segments are intended for the replacement market, where they can be sold as a kit, thus forming the ring, but also separately.

The objectives of the present invention are achieved by a three-piece oil control ring for internal combustion engines, comprising an expander with which a first upper annular segment and a second lower annular segment having a first inner side surface and a second outer side surface are associated. Onto the expander and/or first and second annular segments a metallic tungsten matrix coating containing tungsten nanocarbides WC, W2C, W3C, W12C or a mixture thereof is applied. Said coating has a thickness ranging between 5 μm and 150 μm, hardness between 1000 HV and 3500 HV and is applied by means of the chemical deposition process (CVD).

Furthermore, the objectives of the present invention are achieved by an expander, for use in the three-piece oil control ring for internal combustion engines, such as disclosed above, comprising a plurality of regions with which the first and second annular elements are associated and onto which a metallic tungsten matrix coating containing tungsten nanocarbides WC, W2C, W3C, W12C or a mixture thereof, with thickness ranging between 5 μm and 150 μm and hardness between 1000 HV and 3500 HV, is applied by means of the chemical deposition process (CVD).

Moreover, the objectives of the present invention are achieved by an annular element for use in a three-piece oil control ring for internal combustion engines, such as disclosed above, said element comprising a first inner side surface and a second outer side surface, onto which a metallic tungsten matrix coating (7) containing tungsten nanocarbides WC, W2C, W3C, W12C or a mixture thereof, with thickness ranging between 5 μm and 150 μm and hardness between 1000 HV and 3500 HV, is applied by means of the chemical deposition process (CVD).

BRIEF DESCRIPTION OF THE DRAWINGS

The present invention will be described in greater detail below based on an example of embodiment displayed in the figures. The figures show the following.

DETAILED DESCRIPTION

Figure 1:
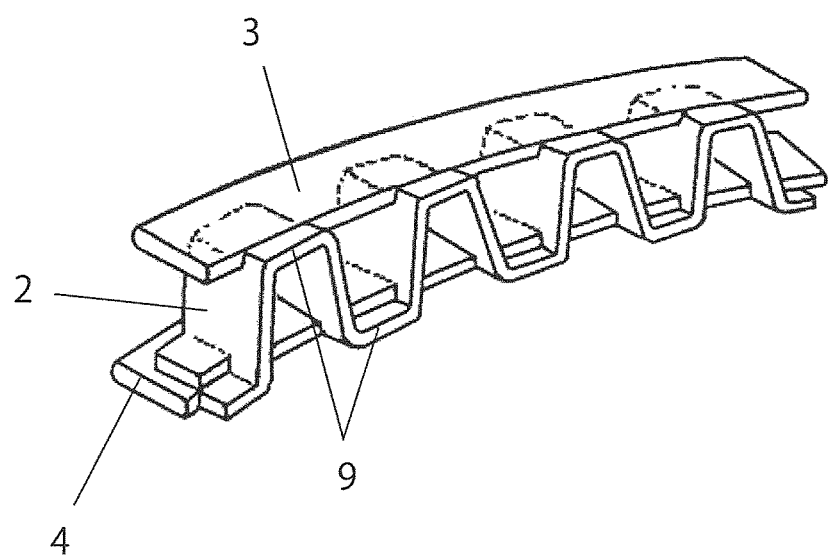
FIG. 1—is a perspective schematic view of a portion of a certain oil scraping ring, wherein the expander and the upper and lower annular segments which form said ring can be visualized.

FIG. 1 shows a three-piece oil control ring for use in the groove of a piston of any internal combustion engine, e.g., the ring 1 object of the present invention. In the figure, which displays a partial perspective view, one can clearly notice the existence of an expander 2 having a substantially annular shape comprising a plurality of regions 9 (called pads) for the association of a first upper annular element 3 and a second lower annular element 4, each having, respectively, a first inner side surface 5 and a second outer side surface 6.

The expander 2 presses the first and the second annular elements 3, 4 against the cylinder wall when the ring is duly mounted on the engine and controls the thickness of the oil film on the cylinder wall.

The main novelty of the ring object of the present invention lies in the fact that the expander 2 and/or the first and second annular segments 3, 4 are coated with a tungsten carbide WC) coating 7 applied by means of the chemical deposition process (CVD), which is something that has never been disclosed by any prior-art document and that imparts to the present ring extremely advantageous durability and manufacture cost characteristics.

In a three-piece oil ring, the wear occurs primarily in the region of contact between the inner side surfaces 5 of the annular segment 3, 4 and the pads 9 of the expander.

In most of the conventional products, a coating of chromium nitride is applied to the region of pads 9 through the physical vapor deposition (PVD) or galvanic process. Another common technique currently consists in executing a nitriding procedure in the expander element by gaseous diffusion (with nitrogen diffusion). Said chemical element, diffused in the surface, increases its resistance to the wear of the part.

The application of a coating 7 of tungsten carbide to the expander element 2 and to the first and second annular segments 3, 4 in the ring object of the present invention, it is especially adequate to the expander element due to 2 its complex geometry, for it guarantees easily and economically the deposition of a film in the desired thickness in locations such as the pads 9.

Describing in other words, by being filed homogenously to all the expander element, the coating 7 is applied to the regions 9 of the expander element to which the first and the second annular elements 3, 4 are associated.

The chemical vapor deposition process (CVD) is used for the application of coating in a specific substrate. As a general rule, a substrate is exposed in an environment in which volatile elements react and are deposited homogeneously in the whole exposed surface, being therefore specially indicated for the expander 2.

Besides of homogeneously applying the tungsten carbide coating 7 to the expander element 2, adequately coating the pads 9, the same process of CVD is used for applying to the first and second annular segments 3, 4 which preferably, but not necessarily exhibit identical format and constitution.

Figure 2:
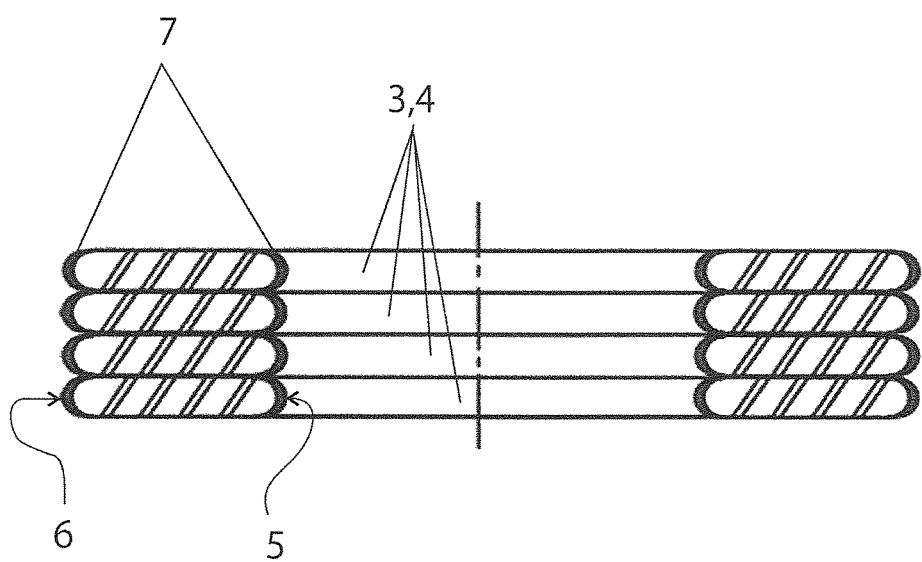
FIG. 2—is a schematic figure of a plurality of annular segments onto which the tungsten carbide coating was applied by means of the chemical deposition process (CVD) on the respective inner and outer side surfaces.
Figure 3:
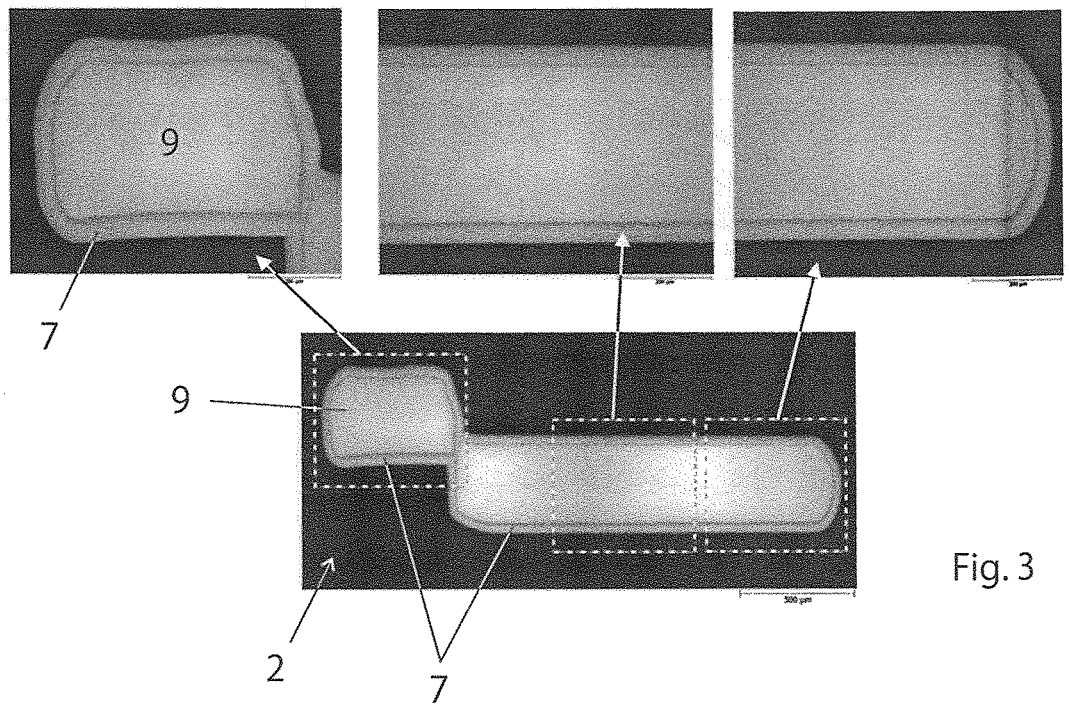
FIG. 3—corresponds to a sectional photograph of the expander of the ring which is the object of the present invention and three enlarged views.

In a preferred manner, a series of annular segments 3, 4 is set as illustrated in FIG. 2, and this stack is placed in the environment where the coating will be applied. Due to the reduced thickness of the segments, it is possible to set dozens of segments, which creates a total inner lateral surface and a big total outer lateral surface, behold, the sum of the surfaces of each one of the stacked segments.

Thus, in a sole step, it is possible to apply the coating to the inner and outer surfaces 5, 6 of various annular segments 3, 4, which makes the manufacture of said components very economical.

Alternatively, it is possible to apply the coating of a tungsten carbide by CVD only to an inner surface 5 of the annular segment 3, 4, only to the outer surface 6, or still to the whole surface of the annular segment, unless the resulting invention is no longer included in the scope of protection of the appended claims. As another possible, but not mandatory, alternative the coating 7 applied to the inner side surface 5 presents thickness of no more than 70% of the thickness of the coating applied to the outer side surface 6.

In a preferred embodiment, the process of CVD is performed in a temperature substantially between 450° C. and 650° C., considerably lower in comparison to the temperatures normally used in such type of process (1000° C.), ensuring that there is no damage to the substrate (expander 2 and/or annular segments 3, 4) by the exposure to high temperatures. The coating 7 is obtained by the chemical reaction of gases, namely, the tungsten hexafluoride as the gas which provides the metal, the hydrogen gas, as the reactive gas and a gas as propane or, which serves as carbon source.

The combination of said in specified proportions, in contact to the heated substrate (expander 2 and/or annular segments 3, 4) the coating is formed, which equally covers it.

In a preferable way, the aforesaid gases are inserted in specific proportions so that the metallic tungsten matrix coating 7 containing tungsten nanocarbide WC, $W_2C$, $W_3C$, $W_{12}C$ or a mixture thereof, with thickness between 5 μm and 150 μm (more preferably between 5 μm and 40 μm) and hardness between 1000 HV and 3500 HV.

Figure 4:
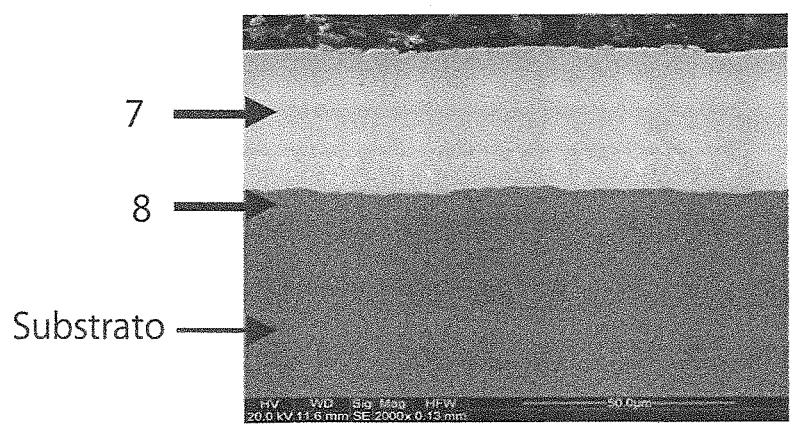
FIG. 4—corresponds to a detailed view of the tungsten carbide coating on the piston ring which is the object of the present invention.
Figure 5:
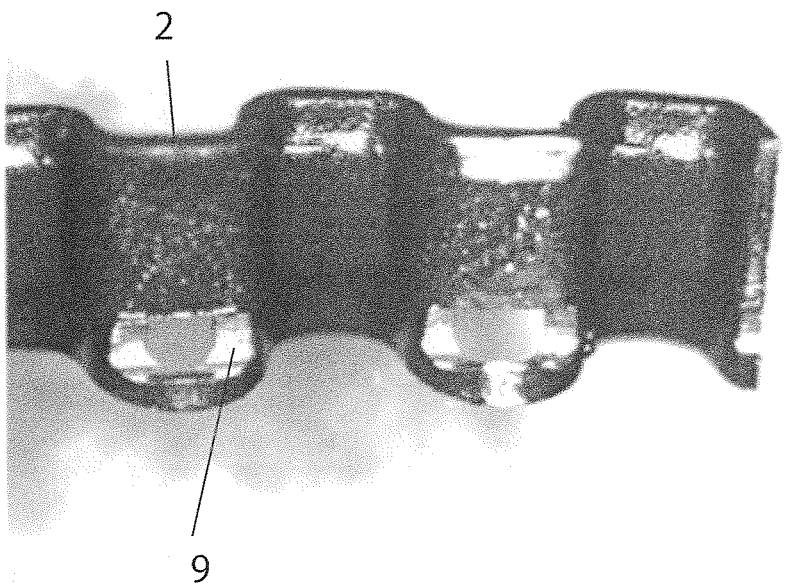
FIG. 5—is a photograph of an expander of a currently known oil ring, wherein a significant wear after a certain time of use can be noticed.
Figure 6:
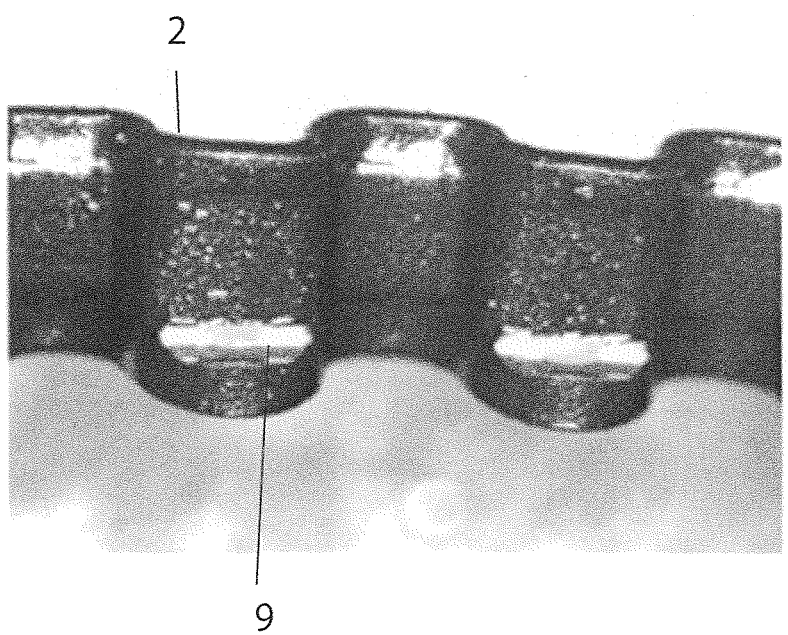
FIG. 6—is a photograph of the expander of an oil ring of the ring which is the object of the present invention, whose wear was significantly lighter than that of the expander shown in FIG. 5.

Also preferably, it is previously applied a pure nickel layer 8 with adhesive function to the coating 7 (bonding layer, see FIG. 4), having a preferred thickness between 1 μm and 5 μm. The pure nickel layer favors adhesion of the tungsten carbide layer formed and deposited by the CVD process.

Also according to a preferred, non-limiting embodiment, due to the reduced percentage of tungsten carbide the Young's modulus (E) is about 410 GPa, therefore similar to the percentage of pure tungsten metal. This is an ad-vantage over the coatings obtained by physical vapor deposition (PVD), which has typical values around 250 GPa.

As a characteristic of the formed tungsten carbide coating 7, it presents a hardness variation so that the hardness of the surface is reduced according to the depth of the coating, the reduction being of up to 50% compared to the hardness of the surface.

The piston ring which is object of the present invention has a number of advantages and benefits over the rings currently known, namely:
 (a) increase of the tenacity and excellent adhesion of the coating 7 compared to the existing solutions;
 (b) increase of the piston's life by deposition of the tungsten carbide coating in the regions of the expander 2, wherein the deposition is currently difficult, as in the pads 9;
 (c) increased resistance to fatigue of the ring due to the elimination of the nitride layer;
 (d) increased resistance to wear in the inner 5 and outer 6 surfaces of the annular segments 3, 4.

It should be noted that they are also new inventions and have inventive activity, and that the expander element 2 and the annular element 3, 4 are constructed according to the provisions of the present invention. These elements separately are important not only because they conform the present piston ring, but also because they are sold separately in the aftermarket.

In essence, the expander element 2 for use in the present three-piece oil control ring for internal combustion engines comprise a plurality of regions (pads 9) to which the first and second annular elements 3, 4 are linked. To those regions it is applied by the chemical vapor deposition process (CVD) a metallic tungsten matrix coating 7 containing WC, $W_2C$, $W_3C$, $W_{12}C$ tungsten nanocarbides or a mixture thereof, with a thickness between 5 μm and 150 μm and a hardness between 1000 HV and 3500 HV.

The annular element 3, 4 for use in the present three-piece oil control ring for internal combustion engines, in turn, contains the referred first inner side surface 5 and second outer side surface 6, and thereto it is applied by the chemical vapor deposition process (CVD) a metallic tungsten matrix coating 7 containing WC, $W_2C$, $W_3C$, $W_{12}C$ tungsten nanocarbides or a mixture thereof, with a thickness between 5 μm and 150 μm and a hardness between 1000 HV and 3500 HV.

Since it was described an example of preferred embodiment, it must be understood that the scope of the present invention encompasses other possible variations, such as the use of surface treatments and ceramic and metal coatings, with the purpose of improving the wear and corrosion resistance characteristics and reducing the frictional forces, thus being limited only by the content of the appended claims, including possible equivalents.

The invention claimed is:

1. A three-piece oil ring for an internal combustion engine, comprising:
an expanding element defining at least a first side and a second side opposite the first side, a first upper annular segment associated with the first side of the expanding element and a second lower annular segment associated with the second side of the expanding element, wherein each of the first annular segment and the second annular segment include a first internal side surface and a second external side surface, and a chemical vapor deposition coating of a metallic tungsten matrix material homogeneously dispersed on at least one of the expanding element, the first annular segment and the second annular segment, the metallic tungsten matrix material containing a distribution of tungsten nanocarbides including at least one of WC, W2C, W3C and W12C, wherein the coating includes a thickness between 5 μm and 150 μm and a hardness between 1000 HV and 3500 HV; and
wherein the coating defines an external surface facing away from the at least one of the expanding element, the first annular segment and the second annular segment, and wherein the distribution of tungsten nanocarbides provides a hardness variation in the coating such that the hardness at the external surface is reduced according to a depth of the coating away from the external surface.

2. The ring according to claim 1, wherein the hardness variation defines a reduction in hardness of up to 50% as compared to the hardness of the coating at the external surface.

3. The ring according to claim 1, wherein the coating is disposed only on at least one of the internal side surface and the external side surface of the at least one of the first annular segment and the second annular segment.

4. The ring according to claim 1, wherein the coating is disposed on all surfaces of at least one of the first annular segment and the second annular segment.

5. The ring according to claim 3, wherein the thickness of the coating disposed on the internal side surface of the at least one of the first annular segment and the second annular segment is less than or equal to 70% of the thickness of the coating disposed on the external side surface of the at least one of the first annular segment and the second annular segment.

6. The ring according to claim 1, wherein the expanding element includes at least one first region on the first side interfacing with the first annular segment and at least one second region on the second side interfacing with the second annular segment, wherein the coating is disposed on the at least one first region and the at least one second region of the expanding element.

7. The ring according to claim 1, further comprising a pure nickel layer underlying the coating to facilitate adhesion of the metallic tungsten matrix material.

8. The ring according to claim 1, wherein the coating is deposited at a temperature between 450° C. and 650° C.

9. An expanding element for a three-piece oil ring, comprising:

a plurality of first regions configured to interface with a first annular segment;
a plurality of second regions configured to interface with a second annular segment; and
a chemical vapor deposition coating homogeneously dispersed on at least one of the plurality of first regions and the plurality of second regions, the coating composed of a metallic tungsten matrix material containing a distribution of tungsten nanocarbides including at least one of WC, W2C, W3C and W12C, wherein the coating includes a thickness between 5 μm and 150 μm and a hardness between 1000 HV and 3500 HV; and
wherein the coating defines an external surface facing away from the at least one of the plurality of first regions and the plurality of second regions, and wherein the distribution of tungsten nanocarbides provides a hardness variation in the coating such that the hardness at the external surface is reduced according to a coating depth from the external surface, the coating depth being defined by a direction running orthogonal to the at least one of the plurality of first regions and the plurality of second regions.

10. An annular segment for a three-piece oil ring, comprising:
a first internal side surface and a second external side surface, and a chemical vapor deposition coating of a metallic tungsten matrix material homogeneously dispersed on at least one of the first internal side surface and the second external side surface, the metallic tungsten matrix material of the coating having a distribution of tungsten nanocarbides including at least one of WC, W2C, W3C and W12C, wherein the coating includes a thickness between 5 μm and 150 μm and a hardness between 1000 HV and 3500 HV;
wherein the coating defines an external surface facing away from the at least of the first internal side surface and the second external side surface, and wherein the distribution of tungsten nanocarbides provides a hardness variation in the coating such that the hardness of the coating is reduced from the external surface according to a depth of the coating, the coating depth being defined by a distance from the external surface in a direction running orthogonal to the at least one of the first internal side surface and the second external side surface; and
wherein the coating has a greater hardness at the external surface than away from the external surface along the coating depth.

11. The annular segment according to claim 10, wherein the coating is disposed only on at least one of the internal side surface and the external side surface.

12. The annular segment according to claim 10, wherein the first internal side surface and the second external side surface merge with two transverse surfaces, wherein the coating covers the first internal side surface, the second external side surface and the two transverse surfaces.

13. The annular element according to claim 10, wherein the hardness variation defines a reduction in hardness of up to 50% as compared to the hardness of the coating at the external surface.

14. The annular segment according to claim 10, wherein the thickness of the coating on the internal side surface is less than or equal to 70% of the thickness of the coating on the external side surface.

15. The annular segment according to claim 10, further comprising a pure nickel layer underlying the coating to facilitate adhesion of the metallic tungsten matrix material.

16. The expanding element according to claim 9, wherein the hardness variation defines a reduction in hardness of up to 50% as compared to the hardness of the coating at the external surface.

17. The expanding element according to claim 16, further comprising a pure nickel layer disposed between at least one of (i) the coating and the plurality of first regions and (ii) the coating and the plurality of second regions.

18. The expanding element according to claim 9, further comprising a pure nickel layer underlying the coating to facilitate adhesion of the metallic tungsten matrix material.

19. The ring according to claim 1, wherein the coating has a Young's modulus of about 410 GPa.

* * * * *